United States Patent [19]

Abe et al.

[11] Patent Number: 5,028,797
[45] Date of Patent: Jul. 2, 1991

[54] AN ALIGNMENT SYSTEM FOR ALIGN FIRST AND SECOND OBJECTS USING ALIGNMENT MARKS

[75] Inventors: Naoto Abe, Isehara; Shigeyuki Suda; Koji Uda, both of Yokohama; Hirohisa Ohta, Sagamihara; Noriyuki Nose, Machida, all of Japan

[73] Assignee: Canon Kabushiki Kaisha, Tokyo, Japan

[21] Appl. No.: 413,739

[22] Filed: Sep. 28, 1989

[30] Foreign Application Priority Data

Sep. 30, 1988 [JP] Japan .................................. 63-246648

[51] Int. Cl.5 ............................................ G01N 21/86
[52] U.S. Cl. ..................................... 250/548; 250/557; 356/401
[58] Field of Search ................... 250/548, 237 G, 557, 250/561; 356/399-401

[56] References Cited

U.S. PATENT DOCUMENTS

| | | | |
|---|---|---|---|
| 4,398,824 | 8/1983 | Feldman et al. | 356/401 |
| 4,634,876 | 1/1987 | Ayata | 356/400 |
| 4,725,737 | 2/1988 | Nakata et al. | 250/548 |
| 4,815,854 | 3/1989 | Tanaka et al. | 356/401 |
| 4,818,879 | 4/1989 | Kajikawa | 356/401 |
| 4,838,693 | 6/1989 | Uchida et al. | 356/363 |
| 4,880,308 | 11/1989 | Shirasu | 250/548 |

FOREIGN PATENT DOCUMENTS 53-135653 11/1978 Japan .

*Primary Examiner*—David C. Nelms
*Assistant Examiner*—S. B. Allen
*Attorney, Agent, or Firm*—Fitzpatrick, Cella, Harper & Scinto

[57] ABSTRACT

An alignment system for aligning a mask and a wafer into a predetermined positional relationship uses alignment marks provided on the mask and the water. In this system, light from a light source is directed to the alignment marks of the mask and the wafer and, then, the light from these alignment marks is detected by an accumulation type photoelectric converting device, for alignment of the mask and the wafer. The accumulation time of the photoelectric converting device is controlled to be sufficiently longer than or to be equal to a multiple, by an integral number, of the period of relative and natural vibration of the mask and the wafer. This makes it possible to reduce the effect of the relative vibration of the mask and the wafer upon the alignment result and, therefore, makes it possible to enhance the alignment precision.

14 Claims, 5 Drawing Sheets

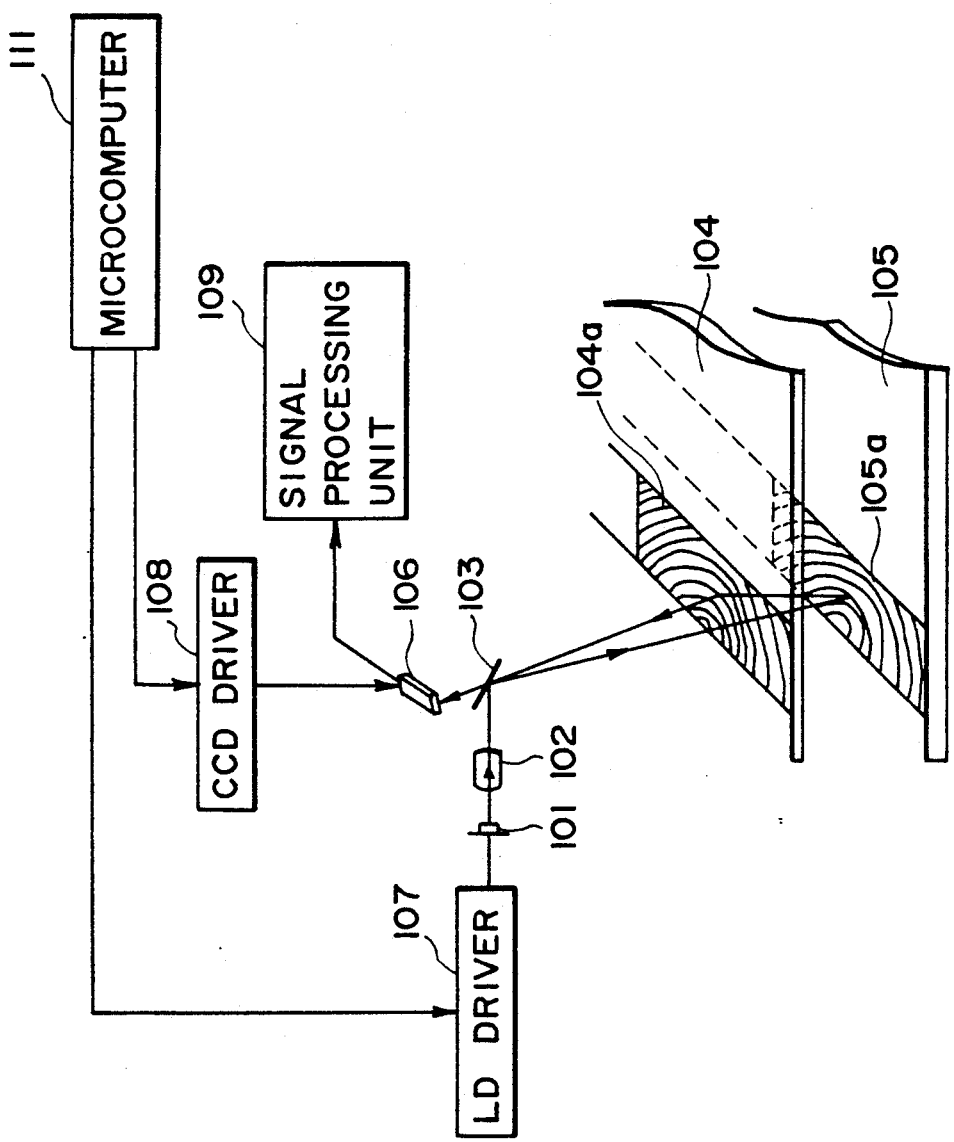
F I G. 4

AN ALIGNMENT SYSTEM FOR ALIGN FIRST AND SECOND OBJECTS USING ALIGNMENT MARKS

FIELD OF THE INVENTION AND RELATED ART

This invention relates generally to an alignment system for correctly positioning an object. More particularly, the invention is concerned with a position detecting method and apparatus suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor for ensuring improved performance. Particularly, as for an alignment system employed in recent exposure apparatuses, submicron alignment accuracies or more strict accuracies are required in consideration of the demand for an higher degree of integration of semiconductor devices.

In many types of alignment systems, features called "alignment patterns" are provided on a mask and a wafer and, by utilizing positional information obtainable from these patterns, the mask and wafer are aligned.

FIG. 5 is a schematic view of a major part of an alignment system as proposed in Japanese Laid-Open Patent Application, Laid-Open No. Sho 53-135653.

In FIG. 5, light from a laser 501 passes a lens 601 and is reflected by a rotating polygonal mirror 502. The reflected light impinges on an f-0 lens 503 having a characteristic for providing telecentric emission light. The f-0 lens 503 has its entrance pupil defined at the reflection surface of the polygonal mirror 502. The light passing the f-0 lens 503 enters a lens 602 and impinges on a roof prism 504 by which it is distributed to two, left and right alignment optical systems.

In the FIG. 5 example, the left and right alignment optical systems have symmetrical structures and, therefore, only one alignment optical system will be explained below.

The light distributed by the roof prism 504 is reflected by a half mirror 603 and then goes through a lens 604 and a mirror 605. Then, by an objective lens 505, the light is projected on a reticle 507 surface which is at an image surface of the f-0 lens 503 or at a plane optically conjugate with the image surface, and then on a wafer 509 surface which is at a plane optically conjugate with the reticle 507 surface with respect to a projection lens 508. Rotation of the polygonal mirror 502 is effective to scan the wafer 509 surface in a telecentric state.

On the reticle 507 surface and the wafer 509 surface, there are provided identification marks for alignment purpose such as illustrated in FIG. 6, part (A). More specifically, there are formed reticle alignment marks 507M and wafer alignment marks 509M (which may be called "alignment patterns"), at two left and right sites. When light passes near the alignment pattern, it is specularly reflected by a part in which no edge of the alignment pattern is present so that what can be called a non-scattered light is produced which goes back along its oncoming path. At a part in which an edge of the alignment pattern is present, the light is diffracted or irregularly reflected such that what can be called a scattered light is produced which goes back along its oncoming path.

Of these rays, the non-scattered light and the scattered light passing through the objective lens 505 goes by way of the mirror 605, the lens 604 and the half mirror 603 to a lens 606 and a lens 607. Then, by a slit means (not shown) which is disposed at a position optically conjugate with the pupil plane of the objective lens 505 and which has a central non-transparent area, only the scattered light is allowed to pass therethrough and the light is received by a photodetector (light receiving portion) 511.

In the FIG. 5 example, the scattered light from the alignment pattern is detected to detect the positional deviation between the reticle 3 and the wafer 1 and, on the basis of this, the position adjustment (alignment) is made.

FIG. 6, part (B), illustrates an output signal from the light receiving portion 511 in the case where the positional relationship between the wafer alignment pattern and the mask alignment pattern is such as shown in FIG. 6, part (A). The axis of the abscissa denotes time and the axis of the ordinate denotes the level of output.

Positional errors between the alignment marks of the reticle 507 and the wafer 509 can be determined, by using the characters referred to in FIG. 6(B), in the following manner:

$$dX = V \times (t1 - t2 - t4 + t5)/4$$

$$dY = V \times (t1 - t2 + t4 - t5)/4$$

where V is the scan speed. Namely, as a result of constant-speed laser beam scanning, the measurement is attainable with the position measurement being replaced by time measurement.

The alignment information obtainable with the device shown in FIG. 5 is such positional information that exists just at a moment when the beam from the laser 501 scanned by the polygonal mirror 502 impinges on the alignment marks of the reticle 507 and the wafer 509.

SUMMARY OF THE INVENTION

In a semiconductor device manufacturing exposure apparatus, due to various factors, a mask and a semiconductor wafer are vibrating. For this reason, the alignment information obtained in the manner described above contains an error due to the relative vibration of the mask and the wafer. Such an error may be disregarded in a conventional alignment process to be made in an exposure apparatus of the type arranged to execute an exposure process of a line-and-space of an order of 1.0 micron. However, in an alignment process to be made in an exposure apparatus of the type, such as an X-ray stepper, that executes an exposure process of a line-and-space of an order of 0.25 micron, such error can not be disregarded. In this type of exposure apparatuses, a precision of an order of 0.01 micron is required for the alignment detection.

By way of example, in an attempt to solve this problem, one may consider such a method that the mask-to-wafer alignment information is detected plural times and, from an average of the measured values, the positional error between the mask and the wafer is determined.

However, this method requires a procedure of multiple measurements of alignment information as well as detection of an average of the measured values. Therefore, it requires a long time for the alignment detection. Further, the measurements are intermittent and there is a possibility that, if the period of intermittent measurement is in a certain relationship with the period of the relative vibration of the mask and the wafer, the result obtained from the multiple measurements still contains an error.

It is accordingly an object of the present invention to provide an improved alignment system by which a mask and a wafer can be aligned with high precision.

In an aspect of the present invention, a light receiving means comprises an accumulation type photoelectric converting element and the accumulation time thereof is suitably set in consideration of the period of a natural vibration frequency (which may be called "resonance frequency") of the relative vibration of the mask and the wafer to be aligned with each other.

In one preferred form of the present invention, light from a light emitting means is directed to alignment marks of first and second objects and then to a light receiving means, and by using an output signal from the light receiving means, the alignment of the first and second objects is executed. The light receiving means comprises an accumulation type photoelectric converting means whose accumulation time can be controlled as desired. More specifically, the accumulation time of the accumulation type photoelectric converting element is controlled by using an output signal from a displacement gauge which is provided to detect the natural vibration frequency of the first and second objects.

In another preferred form of the invention, the natural vibration frequency of the first and second objects is measured in preparation and the measured value is memorized in a part of a memory means of the alignment system. The accumulation time of the accumulation type photoelectric converting element is controlled on the basis of an output signal from the memory means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic and diagrammatic view of a major part of an alignment system according to a second embodiment of the present invention.

DESCRIPTION OF THE PREFERRED EMBODIMENTS

Figure 1:
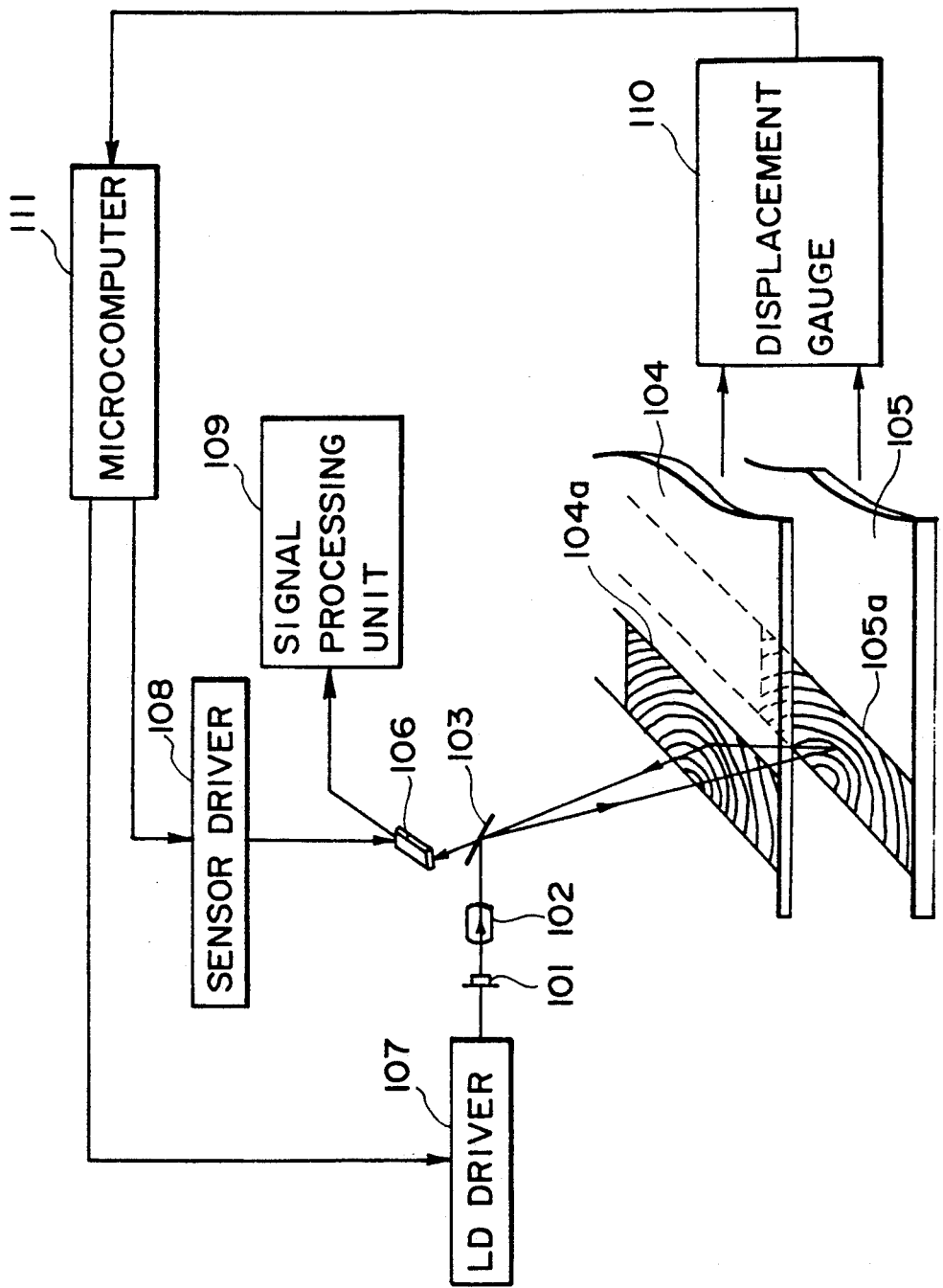
FIG. 1 is a schematic and diagrammatic view of a major part of an alignment system according to a first embodiment of the present invention.

FIG. 1 is a schematic and diagrammatic view of a major part of a first embodiment of the present invention. In FIG. 1, denoted at 101 is a light emitting element which is a semiconductor laser, in this embodiment; and at 102 is denoted a collimator lens for collimating light from the semiconductor laser 101 into a parallel light. Denoted at 103 is a half mirror for reflecting the light from the semiconductor laser toward a mask 104 and a wafer 105. Also, it functions to transmit the light coming back from the mask 104 and the wafer 105. The mask 104 which is a first object comprises a base film made of polyimide, for example, on which a semiconductor circuit pattern of Au, for example, to be printed on the wafer 105 as well as an alignment mark 104a are formed. The alignment mark 104a is provided on one of the surfaces of the mask 104 and is irradiated with the reflected light from the half mirror 103. The wafer 105 which is a second object is made of silicon, for example, on which the semiconductor circuit pattern of the mask 104 is to be printed with a suitable exposure energy. An alignment mark 105a is formed on the wafer 105. Denoted at 106 is an accumulation type photoelectric converting element which is disposed to receive light, having alignment information, coming from the alignment marks 104a and 105a of the mask 104 and the wafer 105, respectively. The photoelectric converting element 106 may comprise a CCD line sensor, for example.

LD driver 107 serves to actuate the semiconductor laser 101 at an externally set light quantity. Sensor driver 108 serves to controllably drive the photoelectric converting element 106 with an externally set accumulation time. Signal processing unit 109 serves to process the output of the photoelectric converting element 106 and to calculate, as an example, the center of gravity of light which bears the positional information. Displacement gauge 110 is provided to measure the relative vibration of the mask 104 and the wafer 105, and it comprises an electrostatic capacitance type displacement gauge, for example.

Microcomputer 111 receives an output of the displacement gauge 110 and operates, on the basis of the relative vibration of the mask 104 and the wafer 105, to set the quantity of light to be provided by the semiconductor laser 101 and also to set the accumulation time of the photoelectric converting element 106, the microcomputer producing and supplying a corresponding signal to the LD driver 107 and the sensor driver 108.

In the present embodiment, where the average position of the alignment mark 104a of the mask 104 (hereinafter, the mark 104a will be referred to simply as "mask") and the alignment mark 105a of the wafer 105 (hereinafter, the mark 105a will be referred to simply as "wafer"), is denoted by S, such position as combined with a deviation N(t) which is variable with time due to the relative vibration of the mask and the wafer, is the actual relative position S(t) of the mask and the wafer at a moment t. Namely, a relationship:

$$S(t) = S + N(t)$$

is present between the mask and the wafer.

Generally, the alignment information required in a semiconductor device manufacturing exposure apparatus is the average position S of the mask and the wafer. Conventionally, the deviation N(t) due to the relative vibration of the mask and the wafer is quite small as compared with the required resolution for the mask-to-wafer position S. Therefore, it follows that:

$$S(t) = S + N(t) \approx S$$

Accordingly, even if the actual mask-to-wafer position S(t) at the moment t is measured position, the measured is almost the same as the average position S of the mask and the wafer. Thus, no problem has arisen.

The signal processing unit 109 processes the output S'(i) of the photoelectric converting element (hereinafter "line sensor") 106, and calculates the relative position of the mask and the wafer. Here, S'(i) denotes the output of the i-th one of plural detecting elements (of a number m) that constitute the line sensor 106.

The i-th output S'(i) of the line sensor 106 is one that has been obtained as a result of impingement on the line sensor 106 of the light bearing the information on the sum of the relative position S of the mask and the wafer and the deviation N(t) due to the relative vibration of the mask and the wafer. If these light components are denoted by LS(i) and LN(i,t), then, the output S'(i) from the line sensor 106 corresponds to the result of integration, with the accumulation time Ct, of the aforementioned light incident on the line sensor 106. Thus, it can be expressed as follows:

$$S'(i) = K \times \int_O^{Ct} [LS(i) + LN(i,t)] dt \quad (1)$$

wherein K is the detection sensitivity of the line sensor 106.

Figure 2A:
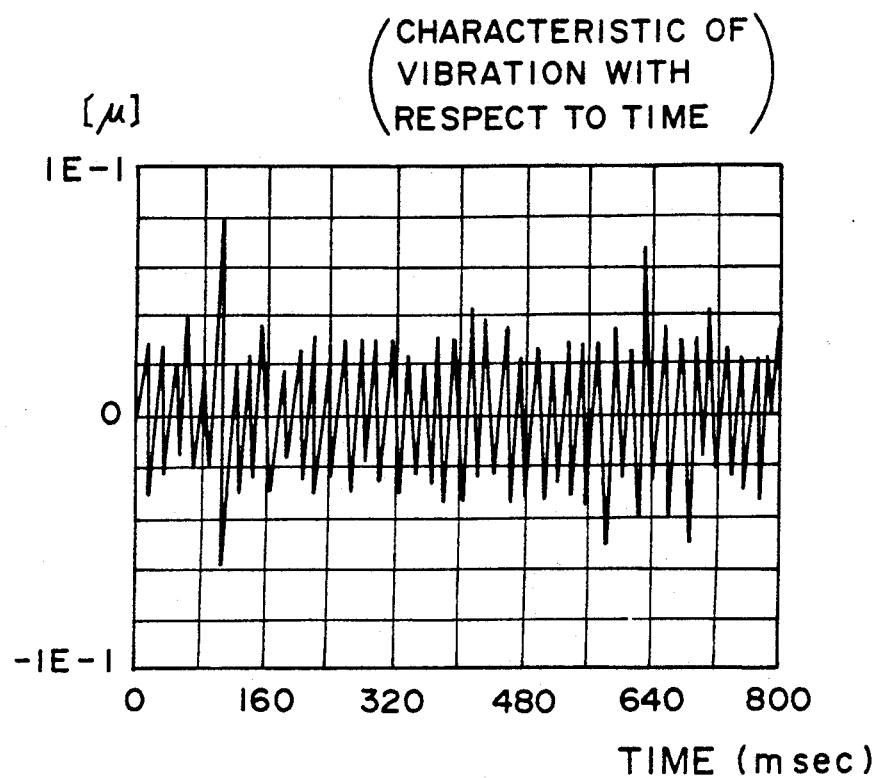
FIGS. 2A and 2B illustrate the results of measurement of deviation due to the relative vibration of a mask and a wafer.
Figure 2B:
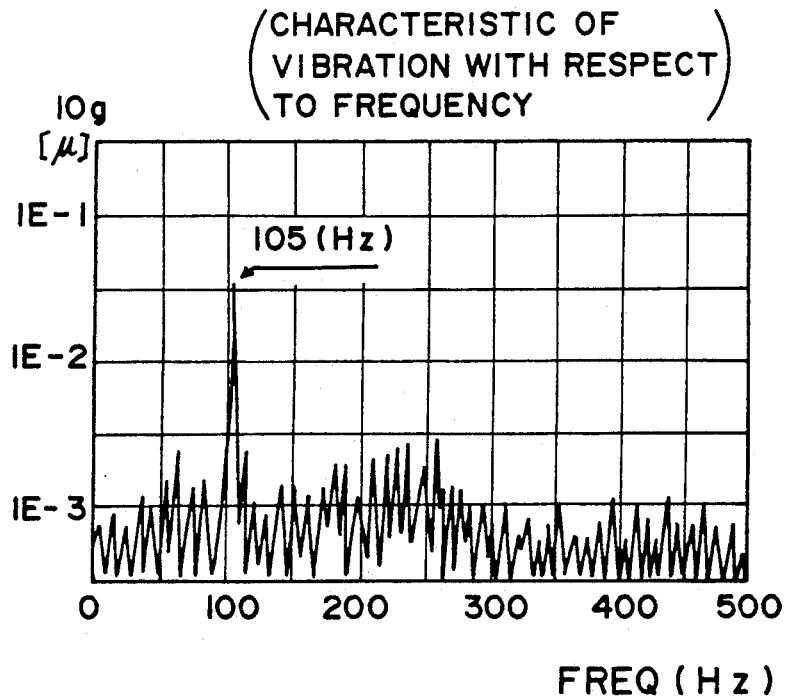

As for the deviation N(t) due to the relative vibration of the mask and the wafer, chiefly, one resulting from the mechanical resonance of structural parts supporting the mask 104 and the wafer 105 is dominant. For example, in the present embodiment, it has been confirmed by actual measurement that the relative vibration of the mask 104 and the wafer 105 is a minute vibration such as illustrated in FIG. 2A. Further, as a result of measurement, it has been confirmed that, such as shown in FIG. 2B, the relative vibration of the mask 104 and the wafer 105 is such a system as having a natural vibration frequency at 105 (Hz).

The period Twm of the natural vibration frequency to the natural vibration frequency fwm of the relative vibration of the mask 104 and the wafer 105 is:

$$Twm = -1/fwm$$

Since, as for the amplitude of the relative vibration of the mask 104 and the wafer 105, one deriving from the natural vibration frequency fwm is dominant, if the accumulation time Ct is made sufficiently longer than the period Twm, namely, $$Ct >> Twm$$

and thus, $$\int_O^{Ct} LS(i) dt >> \int_O^{Ct} LN(i,t) dt$$

then, the effect of the deviation N(t) on the output S'(i) is reduced. Therefore, the output S'(i) as expressed by equation (1) may be considered as:

$$S'(i) \approx k \times \int_O^{Ct} [LS(i)] dt \quad (2)$$

If the accumulation time Ct is made four or five times longer than the period Twm, then, the signal to-noise ratio of the output S'(i), that is, $$S/N \approx \int_O^{Ct} LS(i) dt / \int_O^{Ct} LN(i,t) dt$$

can be increased by one figure or more. Therefore, taking the output S'(i) as being represented by equation (2) does not cause inconveniences.

Setting an accumulation time Ct which is n times larger than the period Twm (where n is an integral number), rather than setting the time Ct to be sufficient longer than the period Twm or in addition to doing so, is also effective to reduce the effect of the deviation (t) upon the output S'(i). That is, if $$Ct = n \times Twm \text{ (wherein n is a positive integral number)}$$

then, usually N(t) shows a sine curve. If follows therefor that $$\int_O^{n \times Twm} LN(i,t) dt \approx 0$$

Accordingly, equation (1) can be rewritten as follows:

$$S'(i) \approx k \times \int_O^{n \times Twm} [LS(i)] dt \quad (3)$$

Therefore, deviation N(t) does not affect the output S'(i). In this case, basically n may take any one of integral numbers not less than 1. However, taking into consideration the significance having been described with reference to equation (2), preferably n is an integral number not less than 4. Practically, too long an accumulation time Ct leads to decreased throughput and, therefore, preferably the accumulation time is four or five times larger than the period Twm.

If the number of the detecting elements (i.e., the number of bits) of the line sensor 106 is denoted by m and the signal processing by the signal processing unit 109 is represented by F, then the position S' of the mask 104 and the water 105 to be detected by the signal processing unit 109, can be expressed as follows:

$$S' = F[S'(i)] \quad (8)$$

wherein i = 1 − m

Generally, the position S' of the mask and the wafer detected by the signal processing unit 109 contains an error E which results from an optical error or a processing error. Namely, $$S' = S(t) + E \quad (9)$$

That is:

$$S' = S + N(t) + E \quad (10)$$

In the present embodiment, the accumulation time of the line sensor 106 is selected and set so as to be sufficiently longer than the period Twm of the natural vibration frequency fwm of the relative vibration of the mask and the wafer, more particularly, it is selected and set to the n times larger than the period Twm, wherein n is an integral number not less than 4. If this is done, the output S'(i) of the line sensor 106 is hardly influenced by the relative vibration of the mask and the wafer and, therefore, with regard to the position S' of the mask and the wafer detected by the signal processing unit 109 on the basis of the output of the line sensor 106 it is sufficient to take into account only the error E resulting from the optical error or the processing error. Thus, from equation (10), it follows that:

$$S' \approx S(t) + E$$

As described in the foregoing, in FIG. 1 the accumulation time Ct of the line sensor 106 is set to be longer than the period Twm of the natural vibration frequency fwm of the relative vibration of the mask 104 and the wafer 105. More particularly, the accumulation time Ct of the line sensor 106 is set to be equal to a multiple, by an integral number, of the period Twm of the natural vibration frequency fwm of the relative vibration of the mask 104 and the wafer 105. Thus, in regard to the position S' of the mask and the wafer as detected by the signal processing unit 109, it is sufficient to taken into account only the error E which results from an optical error or a processing error. Therefore, the following equation is obtained:

$$S' \approx S(t) + E$$

This means that the deviation N(t) due to the relative vibration of the mask and the wafer is hardly influential.

Figure 3:
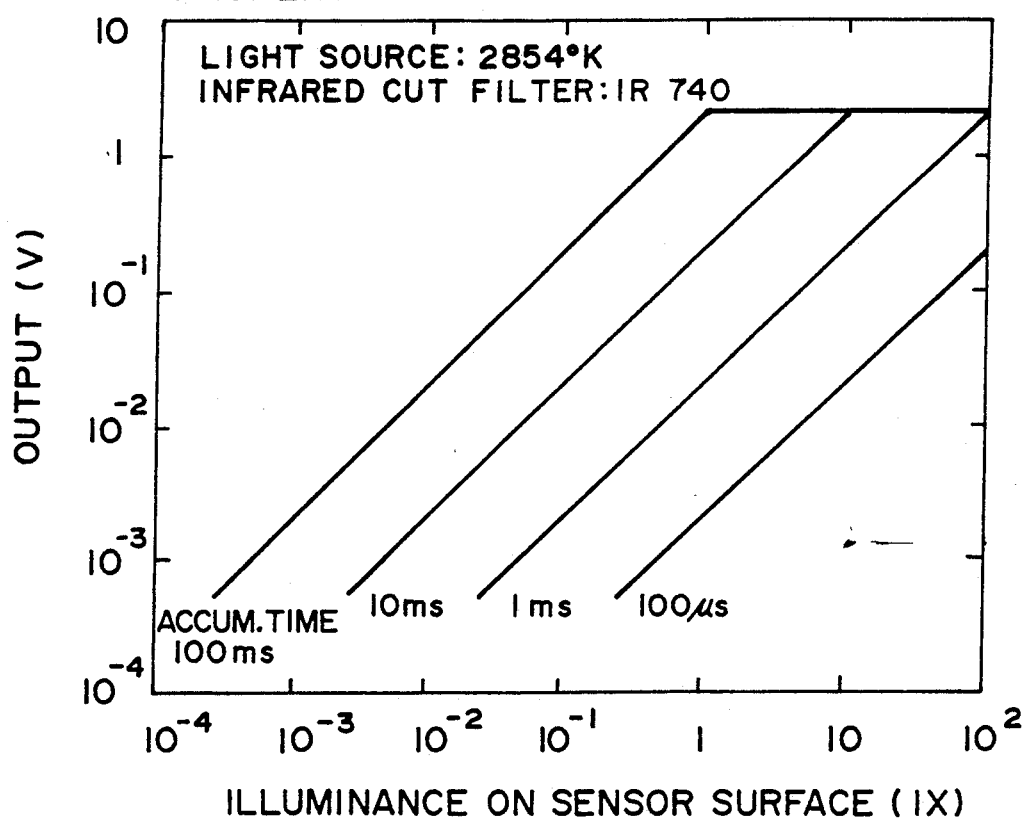
FIG. 3 illustrates the photoelectric conversion property of an accumulation type sensor.
Figure 5:
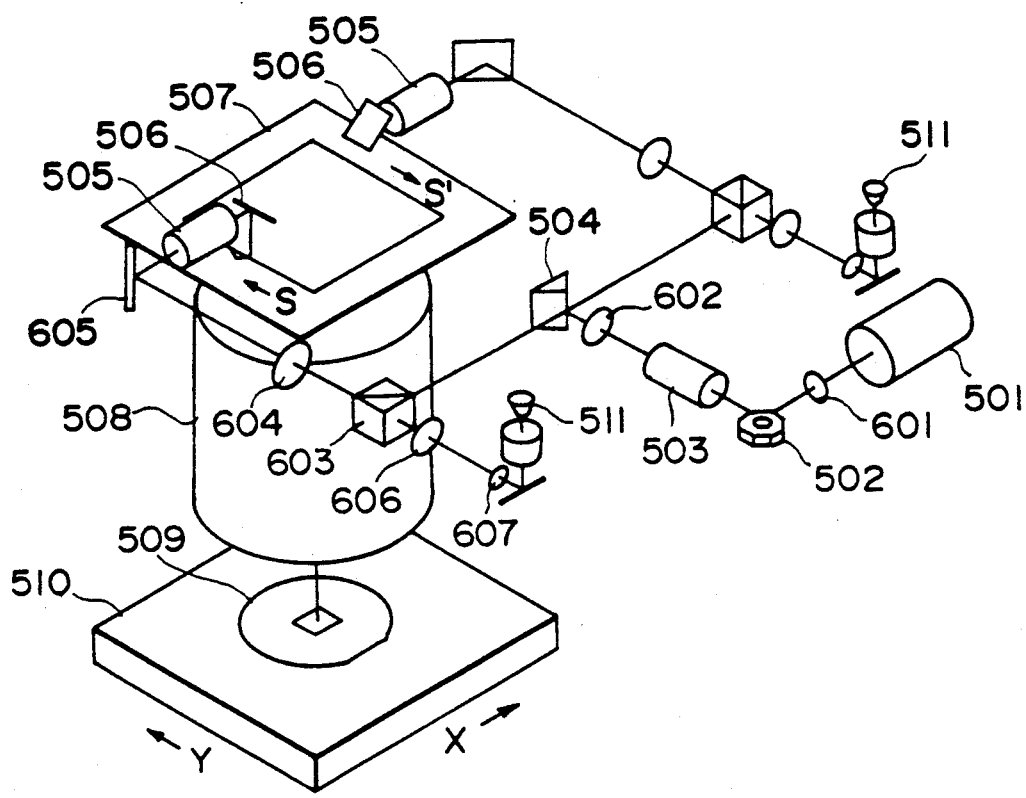
FIG. 5 is a perspective view schematically showing a known type of alignment system.
Figure 6A:
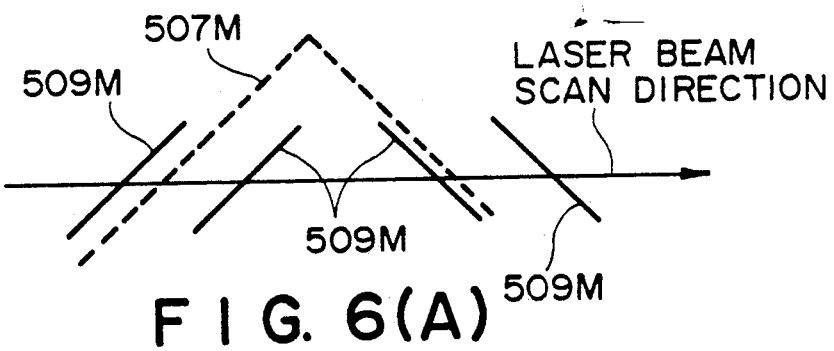
FIGS. 6A and 6B illustrate an output of a photodetector of the FIG. 5 example.
Figure 6B:
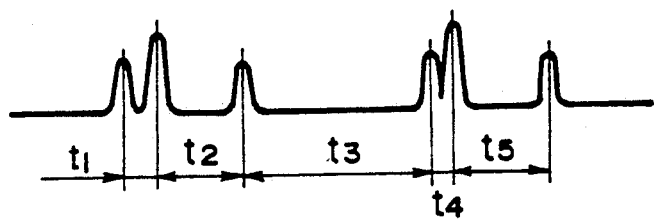

On the other hand, the sensitivity of the line sensor 106 changes with the accumulation time Ct in a manner such as, for example, illustrated in FIG. 3.

As an example, if the accumulation time Ct of the line sensor 106 is modified to be equal to a multiple, by an integral number, of the period Twm of the natural vibration frequency fwm of the relative vibration of the mask 104 and the wafer 105, the sensitivity of the line sensor 106 changes.

When the output of the line sensor 106 is to be processed by the signal processing unit 109, it is desirable that the output is high within a nonsaturation range. It is therefore necessary to control the output of the line sensor 106 to an optimum value as required by the signal processing unit 109.

To this end, in the present embodiment, for providing an optimum output of the line sensor 106, the accumulation time Ct of the line sensor 106 is adjusted so that the optical output Pld of the semiconductor laser 106 satisfies the following condition:

$$Pld \times Ct = \text{const} \quad (11)$$

More specifically, the microcomputer 111 shown in FIG. 1 calculates the period Twm on the basis of the output of the displacement gauge 110 and then sets an optimum accumulation time Ct of the line sensor 106. Then, an optimum value of the optical output Pld of the semiconductor laser 101, to the accumulation time Ct of the line sensor 106, is set.

FIG. 4 is a schematic and diagrammatic view of a major part of a second embodiment of the present invention. In FIG. 4, like numerals as used in FIG. 1 are assigned to the elements corresponding to those in the FIG. 1 example.

In FIG. 4, a microcomputer 111 cooperates with an electrostatic capacitance type displacement gauge (not shown) or otherwise to measure, in preparation, the period Twm of the natural vibration frequency fwm of the relative vibration of the mask 104 and the wafer 105. The measured value is memorized in a memory means within the microcomputer 111 or in a memory means provided in the exposure apparatus. The measured value (data) is transmitted as required to an LD driver 107 or a sensor driver 108.

In an apparatus such as a semiconductor device manufacturing exposure apparatus, even if a mask or a wafer changes, mechanical resonance of a massive stage or other structural parts is dominant. Therefore, the period Twm of the natural vibration frequency fwm of the relative vibration of the mask 104 and the wafer 105 hardly changes. Accordingly, only by preparatory measurement of the period Twm of the natural vibration frequency fwm of the relative vibration of the mask 104 and the wafer 105, which is dependent upon the apparatus, that is, only by setting through the microcomputer 111 the accumulation time which is determined in accordance with the period Twm, substantially the same advantageous effects as described hereinbefore are attainable in the present embodiment.

Further, in the present embodiment, in place of using the microcomputer 111 shown in FIG. 4, the system may be structured with hardware in which a certain fixed accumulation time is determined on the basis of the period Twm of the natural vibration frequency fwm of the relative vibration of the mask 104 and the wafer 105 as measured in preparation by using an electrostatic capacitance type displacement gauge (not shown) or otherwise. Substantially the same effects are attainable.

In each of the foregoing embodiments, the photoelectric converting element comprises a line sensor such as a CCD or the like. However, provided that the accumulation time is controllable, any type of photoelectric converting element may be used. For example, a CCD area sensor may be used.

In accordance with the present invention, as described hereinbefore, an accumulation type photoelectric converting element is used as a light receiving means and the accumulation time is selected and set in accordance with the period of the natural vibration frequency of relative vibration of a mask and a wafer to be aligned with each other. For example, the former is selected to be longer than the latter, more particularly, to be equal to a multiple, by an integral number, of the latter. By this means, it becomes possible to obtain an average of alignment information that contains deviation resulting from the relative vibration of the mask and the wafer.

Thus, the present invention can provide an alignment system having advantageous features that, as compared with the conventional method which requires a procedure of multiple measurements of the alignment information and subsequent averaging of measured values to obtain average alignment information, the time for the alignment detection can be shortened and, therefore, the throughput of the exposure apparatus as a whole can be increased.

While the invention has been described with reference to the structures disclosed herein, it is not confined to the details set forth and this application is intended to cover such modifications or changes as may come within the purposes of the improvements or the scope of the following claims.

What is claimed is:

1. An alignment system for aligning first and second objects by using alignment marks, said system comprising:
   a light source;
   an accumulation type photoelectric converting device;
   an optical arrangement for directing light from said light source to the alignment marks and then to said accumulating type photoelectric converting device;
   detecting means for detecting the period of the natural vibration frequency with respect to the relative vibration of the first and second objects; and
   control means for controlling the accumulation time of said accumulation type photoelectric converting device on the basis of the detection by said detecting means, so that the controlled accumulation time of said accumulation type photoelectric converting device is longer than said period.

2. A system according to claim 1, wherein the controlled accumulation time of said photoelectric converting device is equal to a positive integer multiple of said period.

3. A system according to claim 2, wherein the controlled accumulation time of said photoelectric converting device is equal to a multiple, by an integer not less than 4, of said period.

4. An alignment system for aligning first and second objects by using alignment marks, said system comprising:
   a light source;
   an accumulation type photoelectric converting device;
   an optical arrangement for directing light from said light source to the alignment marks and then to said photoelectric converting device; and
   control means operable to store the period of the natural vibration frequency with respect to the relative vibration of the first and second objects and for determining and controlling the accumulation time of said photoelectric converting device on the basis of said memorized period, so that the controlled accumulation time of said photoelectric converting device is longer than said period.

5. A system according to claim 4, wherein the controlled accumulation time of said photoelectric converting device is equal to a positive integer multiple of said period.

6. A system according to claim 4, wherein the controlled accumulation time of said photoelectric converting device is equal to a multiple, by an integer not less than 4, of said period.

7. An alignment system for aligning first and second objects by using alignment marks, said system comprising:
   a light source;
   an accumulation type photoelectric converting device;
   an optical arrangement for directing light from said light source to the alignment marks and then to said photoelectric converting device;
   detecting means for detecting the period of the natural vibration frequency with respect to the relative vibration of the first and second objects; and
   control means for controlling the accumulation time of said photoelectric converting device on the basis of detection by said detecting means, so that the controlled accumulation time of said photoelectric converting device is equal to an integer multiple of said period.

8. A system according to claim 7, wherein the controlled accumulation time of said photoelectric converting device is equal to a multiple, by an integer not less than 4, of said period.

9. An alignment system for aligning first and second objects by using alignment marks, said system comprising:
   a light source;
   an accumulation type photoelectric converting device;
   an optical arrangement for directing light from said light source to the alignment marks and then to said photoelectric converting device; and
   control means operable to store the period of the natural vibration frequency with respect to the relative vibration of the first and second objects and to determine and control the accumulation time of said photoelectric converting device on the basis of said memorized period, so that the controlled accumulation time of said photoelectric converting device is equal to an integer multiple of said period.

10. A system according to claim 9, wherein the controlled accumulation time of said photoelectric converting device is equal to a multiple, by an integer not less than 4, of said period.

11. A method of aligning first and second objects by use of alignment marks, said method comprising the steps of:
    detecting the period of the natural vibration frequency with respect to the relative vibration of the first and second objects;
    preparing and storing data related to the detected period;
    determining, by using the stored data, the accumulation time of an accumulation type photoelectric converting device which is operable to photoelectrically convert light from the alignment marks illuminated by a light source, into an electrical signal, wherein the determined accumulation time if longer than the detected period;
    setting the optical output of the light source in accordance with the determined accumulation time;
    effecting the accumulation of photoelectrically converted signals of the photoelectric converting device, with the determined accumulation time; and
    aligning the first and second objects by using the accumulated signals.

12. A method according to claim 11, wherein the set accumulation time is equal to a multiple, by an integer, of the detected period.

13. A method according to claim 11, wherein the set accumulation time is equal to a multiple, by a number not less than 4, of the detected period.

14. A method according to claim 11, wherein the optical output of the light source is set so that the product of the optical output of the light source with the accumulation time is maintained substantially constant.

* * * * *

UNITED STATES PATENT AND TRADEMARK OFFICE
CERTIFICATE OF CORRECTION

PATENT NO. : 5,028,797
DATED : July 2, 1991
INVENTOR(S) : NAOTO ABE ET AL.

It is certified that error appears in the above-identified patent and that said Letters Patent is hereby corrected as shown below:

item [54] TITLE PAGE

"ALIGN" should read --ALIGNING--.

item [57] ABSTRACT

Line 3, "water." should read --wafer.--.

COLUMN 1

Line 2, "ALIGN" should read --ALIGNING--.
Line 25, "an" should read --a--.
Line 36, "f-0 lens 503" should read --f-θ lens 503--.
Line 38, "f-0 lens 503" should read --f-θ lens 503--.
Line 40, "f-0 lens 503" should read --f-θ lens 503--.
Line 51, "f-0 lens 503" should read --f-θ lens 503--.

COLUMN 5

Line 4, "measured position, the measured" should read --measured, the measured position--.
Line 49, "Twm=-1/fwm" should read --Twm=1/fwm--.

COLUMN 6

Line 7, "signal to-noise" should read --signal-to-noise--.
Line 19, "sufficient" should read --sufficiently--.
Line 26, "If" should read --It--.
Line 52, "water 105" should read --wafer 105--.

UNITED STATES PATENT AND TRADEMARK OFFICE
CERTIFICATE OF CORRECTION

PATENT NO. : 5,028,797
DATED : July 2, 1991
INVENTOR(S) : NAOTO ABE ET AL.

It is certified that error appears in the above-identified patent and that said Letters Patent is hereby corrected as shown below:

COLUMN 7

Line 6, "the n" should read --be n--.
　　　Line 28, "taken" should read --take--.

COLUMN 10

Line 50, "if" should read --is--.

Signed and Sealed this

Twenty-third Day of March, 1993

Attest:

STEPHEN G. KUNIN

*Attesting Officer*　　　　Acting Commissioner of Patents and Trademarks